(12) United States Patent
Wen et al.

(10) Patent No.: US 12,431,872 B2
(45) Date of Patent: Sep. 30, 2025

(54) SEMICONDUCTOR CIRCUIT AND METHOD FOR OPERATING THE SAME

(71) Applicant: TAIWAN SEMICONDUCTOR MANUFACTURING COMPANY LTD., Hsinchu (TW)

(72) Inventors: Chin-Hua Wen, Miaoli County (TW); Wen-Hung Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 213 days.

(21) Appl. No.: 18/336,153

(22) Filed: Jun. 16, 2023

(65) Prior Publication Data

US 2024/0421803 A1 Dec. 19, 2024

(51) Int. Cl.
*H03K 3/012* (2006.01)
*H03K 17/56* (2006.01)

(52) U.S. Cl.
CPC ............ *H03K 3/012* (2013.01); *H03K 17/56* (2013.01)

(58) Field of Classification Search
CPC ..... H03K 3/012; H03K 17/56; H03K 19/0005
See application file for complete search history.

(56) References Cited

U.S. PATENT DOCUMENTS 8,278,973 B2 * 10/2012 Kuwahara .......... H03K 19/0005
327/112

* cited by examiner

*Primary Examiner* — Menatoallah Youssef
*Assistant Examiner* — Colleen J O Toole
(74) *Attorney, Agent, or Firm* — WPAT LAW; Anthony King

(57) ABSTRACT

A semiconductor device and a method for operating the semiconductor device are provided. The semiconductor device includes a calibration device, an adjustment device and a driver. The calibration device is configured to continuously generate a first signal including a first number of bits. The adjustment device is configured to continuously receive the first signal and generate a second signal according to the last two bits of the first signal The second signal includes a second number of bits, and the second number is different from the first number. The driver is electrically coupled to the adjustment device, wherein an output resistance of the driver is controllable in response to the second signal.

20 Claims, 13 Drawing Sheets

SEMICONDUCTOR CIRCUIT AND METHOD FOR OPERATING THE SAME

BACKGROUND

The present disclosure relates, in general, to semiconductor circuits and methods for operating the same. Specifically, the present disclosure relates to semiconductor circuits with low capacitance loading and high resolution and methods for operating the same.

Accurate control of electrical features such as output resistance plays an important role in high speed drivers. Increasing the number of transistors can contribute to decreased quantization error and increased resolution and step size. However, power consumption and capacitance loading will be adversely increased.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

Figure 1:
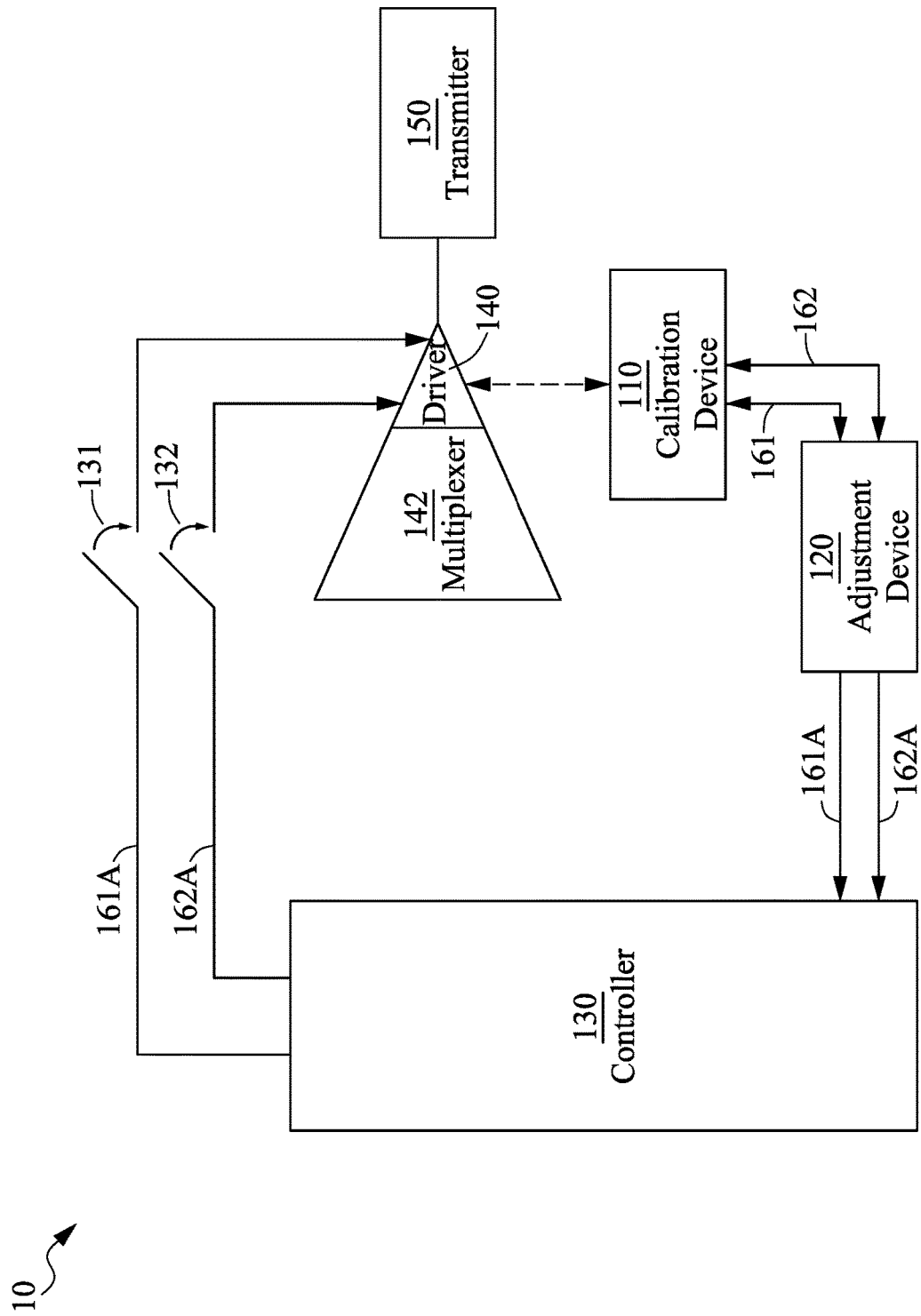
FIG. 1 is a block diagram of a semiconductor circuit, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially." "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a block diagram of a semiconductor circuit 10, in accordance with some embodiments of the present disclosure. The semiconductor circuit 10 can include, for example, a calibration device 110, an adjustment device 120, a controller 130, two switches 131 and 132, a driver 140, a multiplexer 142 and a transmitter 150.

The various illustrative logical blocks, modules and circuits described above in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The calibration device 110 is electrically coupled to the adjustment device 120 and the driver 140. The calibration device 110 can be configured to detect an electrical feature of the driver 140 in order to generate a set of signals, such as the signals 161 and 162. The calibration device 110 can be used to continuously provide signals such as the signals 161 and 162 to the adjustment device 120. The signal 161 can be used to adjust or control the output resistance of the pull-up portion of the driver 140. The signal 161 can be used to adjust or control the operating voltages of the pull-up portion of the driver 140. The signal 162 can be used to adjust or control the output resistance of the pull-down portion of the driver 140. The signal 162 can be used to adjust or control the operating voltages of the pull-down portion of the driver 140.

In some embodiments, the signals 161 and 162 are created by the calibration device 110 in response to the electrical feature of the driver 140. The electrical feature can include various parameters, such as a process, voltage or temperature of the driver 140. In some embodiments, a process, voltage and temperature (PVT) calibration mechanism can be utilized by the calibration device 110 for monitoring and detecting the driver 140.

The adjustment device 120 can be used to continuously receive the signals 161 and 162 from the calibration device 110. The adjustment device 120 can be configured to generate a set of signals, such as the signals 161A and 162A, in response to the signals 161 and 162. The adjustment device 120 can be used to continuously provide signals, such as the signals 161A and 162A, to the controller 130. In some embodiments, each of the signals 161 and 162 includes a first number of bits. Each of the signals 161A and 162A includes a second number of bits. In some embodiments, the first number can be different from the second number. In some embodiments, the first number can be less than the second number.

The adjustment device 120 can include a finite state machine (FSM). The adjustment device 120 can be included or embedded within the calibration device 110. In some embodiments, the signals 161A and 162A can be provided by the adjustment device 120 according to the last two bits of the signals 161 and 162 respectively.

In some embodiments, the adjustment device 120 can be configured to determine whether the last two bits of the signal 161 are different from the last two bits of another signal prior to the signal 161. The adjustment device 120 can be configured to determine whether the last two bits of two successive signals 161 transmitted by the calibration device 110 are different. The adjustment device 120 can be configured to determine whether the last two bits of the signal 161 are different from the last two bits of another signal which is received before the signal 161. In some embodiments, the adjustment device 120 can be configured to determine whether the last bit of the signal 161 is a high bit value, which can include "1."

The controller 130 can be electrically coupled between the driver 140 and the adjustment device 120. The controller 130 can be used to continuously receive the signals 161A and 162A from the adjustment device 120. The controller 130 can be configured to transmit or distribute the signals 161A and 162A to a plurality of transistors of the driver 140. The signals 161A and 162A can be allocated by the controller 130 based on a clock or a synchronizing signal, which is not limited by the present disclosure. The switches 131 and 132 can be controlled or operated by the controller 130 in order to timely deliver the signals 161A and 162A to one or more specific transistors of the driver 140.

The driver 140 can be electrically coupled between the controller 130, the calibration device 110 and the transmitter 150. The driver 140 can be configured to receive the signals 161A and 162A from the controller 130. The driver 140 can include a post driver for driving the transmitter 150. The driver 140 can include a pull-up portion and a pull-down portion. The output resistance of the driver 140 can be controllable in response to the signals 161A and 162A. The signals 161A can be used to control the output resistance of the pull-up portion of the driver 140. The signals 162A can be used to control the output resistance of the pull-down portion of the driver 140.

The multiplexer 142 can be electrically coupled to the driver 140. The multiplexer 142 can be configured to enhance or increase frequency of the signals 161A and 162A by arranging the second number of bits in series. The bits of the signals 161A and 162A transmitted by the controller 130 can be arranged in parallel, and the multiplexer 142 can be used to redistribute or reorganize the bits from parallel to serial. Therefore, the frequency of the bits can be enhanced to improve processing speed and save bandwidth.

The transmitter 150 can be driven by the driver 140 of the semiconductor circuit 10. The transmitter 150 can include a silicon interposer or a channel. The transmitter 150 can include a transmission line of a printed circuit board. The transmitter 150 can be used to deliver signals for different mediums.

Figure 2A:
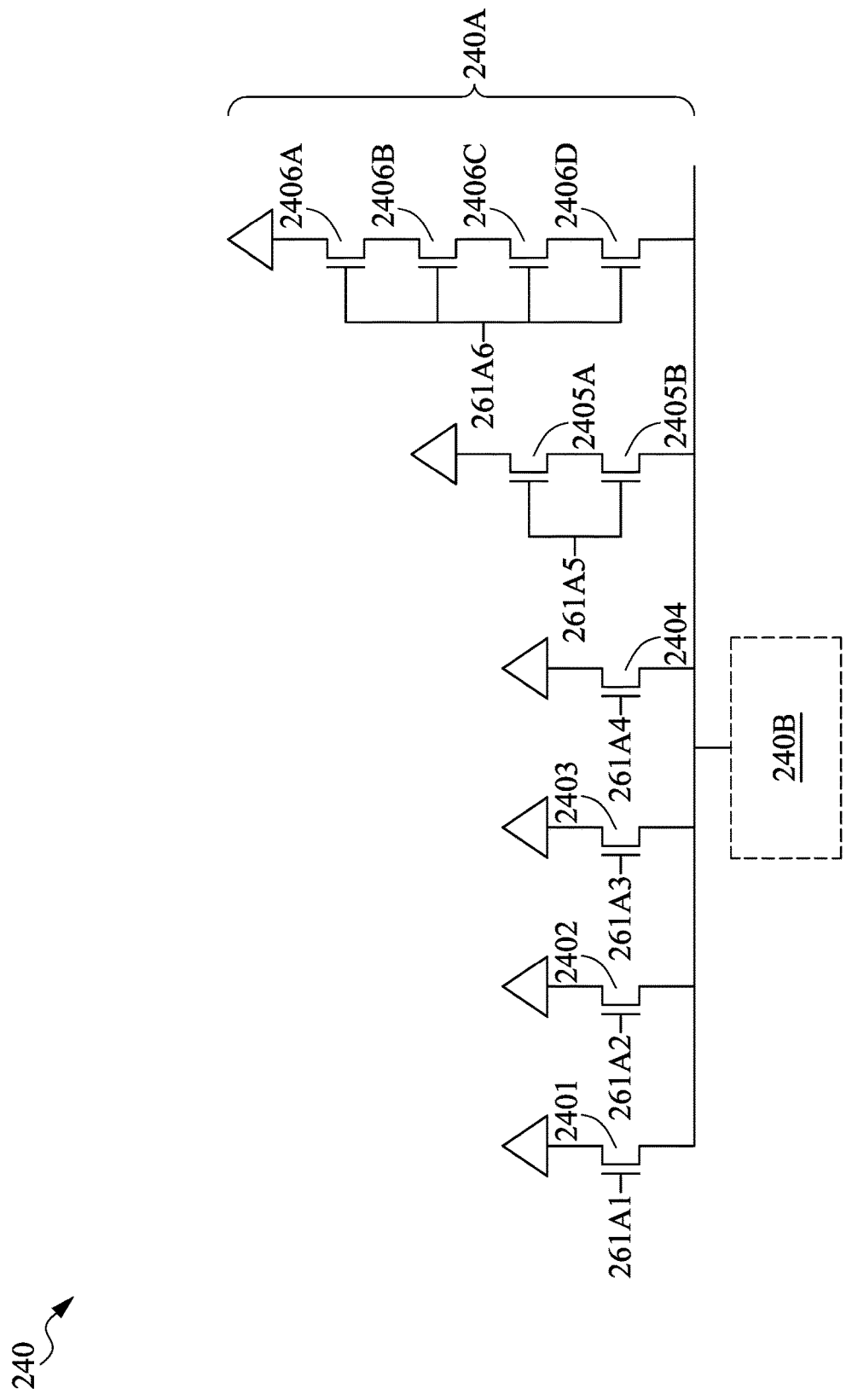
FIG. 2A is a schematic view of a post driver of a semiconductor circuit, in accordance with some embodiments of the present disclosure.

FIG. 2A is a schematic view of a post driver 240 of a semiconductor circuit 10, in accordance with some embodiments of the present disclosure. The post driver 240 can correspond to a portion of the driver 140 of FIG. 1. The post driver 240 can be included in the driver 140 of FIG. 1. The post driver 240 can be used to drive or control another electronic device external to the semiconductor circuit 10.

The post driver 240 can include a pull-up portion 240A and a pull-down portion 240B. Each of the pull-up portion 240A and the pull-down portion 240B can include a plurality of transistor sets. As shown in FIG. 2A, the pull-up portion 240A can include six transistor sets. The number of the transistor sets can be determined according to the resolution or step size required by the semiconductor circuit 10. The number of the transistor sets is proportional to the resolution of the semiconductor circuit 10. The number of the transistor sets is inversely proportional to the step size of the semiconductor circuit 10.

One of the transistor sets can include a transistor 2401, and a signal 261A1 can be received by the gate of transistor 2401. Another transistor set can include a transistor 2402, and a signal 261A2 can be received by the gate of transistor 2402. Another transistor set can include a transistor 2403, and a signal 261A3 can be received by the gate of transistor 2403. Another transistor set can include a transistor 2404, and a signal 261A4 can be received by the gate of transistor 2404. Another transistor set can include two transistors 2405A and 2405B, and a signal 261A5 can be received by the gates of the transistors 2405A and 2405B. Another transistor set can include four transistors, 2406A, 2406B, 2406C and 2406D, and a signal 261A6 can be received by the gates of the transistors 2406A, 2406B, 2406C and 2406D. The signals 261A1, 261A2, 261A3, 261A4, 261A5 and 261A6 can correspond or be identical to the signals 161A and 162A of FIG. 1. Although not depicted in FIG. 2A, it can be contemplated that the post driver 240 can further include an additional transistor set, in which eight transistors are included such that the post driver 240 may include an additional option of resolution.

Figure 2B:
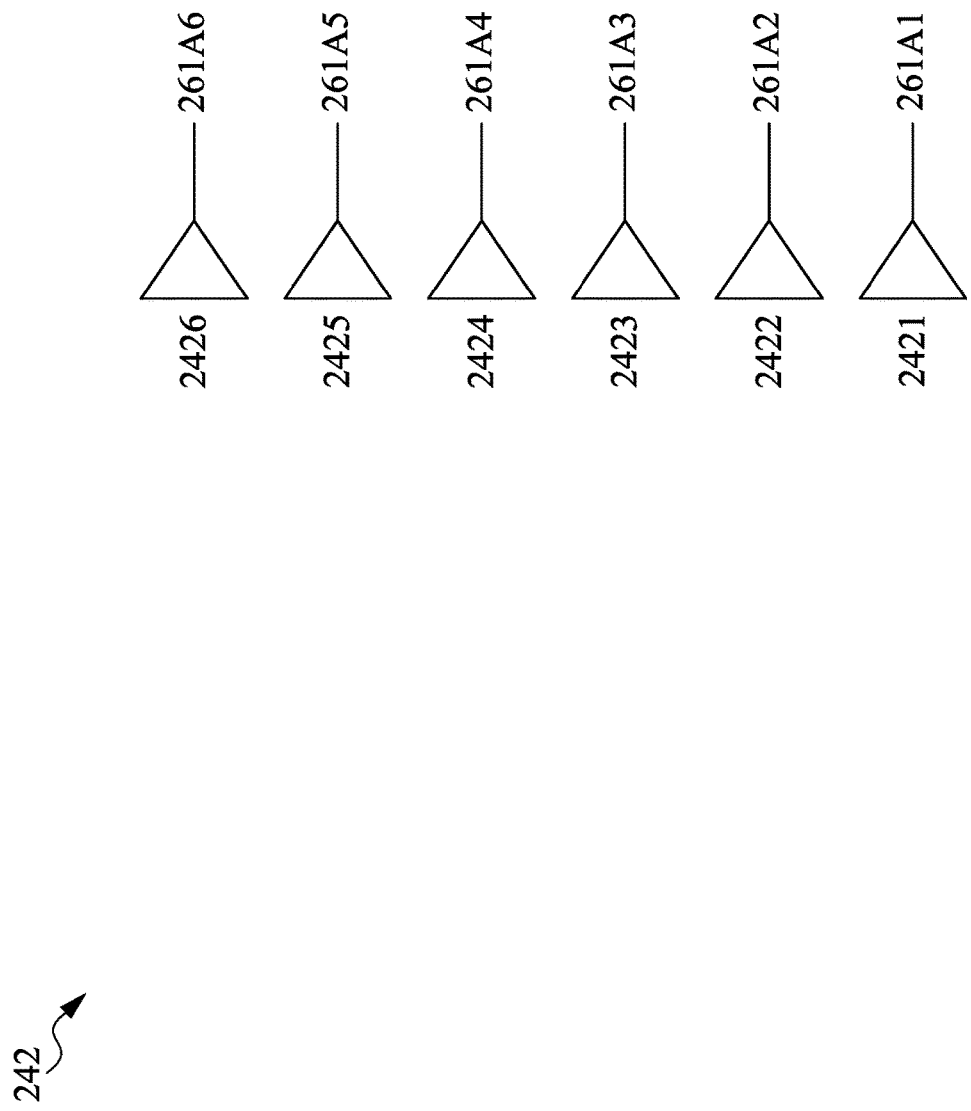
FIG. 2B is a schematic view of a pre-driver of a semiconductor circuit, in accordance with some embodiments of the present disclosure.

FIG. 2B is a schematic view of a pre-driver 242 of a semiconductor circuit 10, in accordance with some embodiments of the present disclosure. The pre-driver 242 can be separated from the post driver 240. The pre-driver 242 can correspond to a portion of the driver 140 of FIG. 1. The pre-driver 242 can be included in the driver 140 of FIG. 1. In some embodiments, the pre-driver 242 can be separated from the driver 140 of FIG. 1.

The pre-driver 242 can include a plurality of electronic components for providing signals to the post driver 240. As shown in FIG. 2B, the pre-driver 242 can include six electronic components 2421, 2422, 2423, 2424, 2425 and 2426, such as operational amplifiers or transistors. The electronic components 2421, 2422, 2423, 2424, 2425 and 2426 can be used to generate signals 261A1, 261A2, 261A3, 261A4, 261A5 and 261A6, respectively. The signals 261A1, 261A2, 261A3, 261A4, 261A5 and 261A6 can be used to drive or enable the pull-up portion 240A of the post driver 240.

Figure 3A:
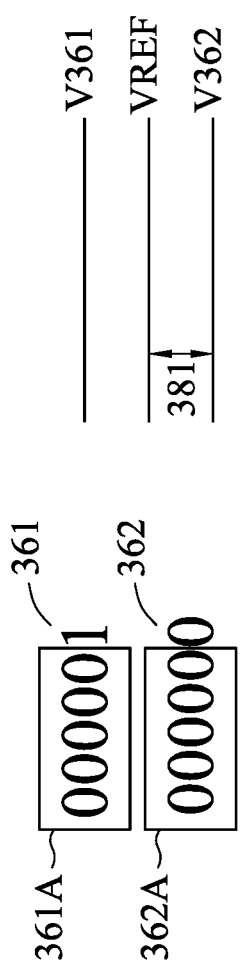
FIG. 3A is a schematic view of two signals and their bit values processed by the adjustment device, in accordance with some embodiments of the present disclosure.

FIG. 3A is a schematic view of two signals and their bit values processed by the adjustment device, in accordance with some embodiments of the present disclosure. The signal 361A can be generated by the adjustment device 120 in response to the signal 361 with a bit value V361. The signal 362A can be generated by the adjustment device 120 in response to the signal 362 with a bit value V362. The reference bit value VREF can be arranged between the bit values V361 and V362 as a target bit value. In some embodiments, the number of bits of the signals 361A and 362A is less than the number of bits of the signals 361 and 362. As shown in FIG. 3A, the signals 361 and 362 have 6 bits, and the signals 361A and 362A have 5 bits.

In the embodiment of FIG. 3A, the last bit "1" of the signal 361 is different from the last bit "0" of signal 362. The second-to-last bit "0" of the signal 361 is identical to the second-to-last bit "0" of signal 362. Accordingly, one of the last two bits of signal 361 is identical to one of the last two bits of the signal 362, and thus the last bit of the signal 362 can be disregarded to generate the signal 362A of "00000." Therefore, the error 381 between the bit value V362 and the reference bit value VREF is approximately half of the LSB (least-significant bit). In some embodiments, an offset error may be included by the error 381 to indicate or represent the error caused by the operational amplifier of the driver.

In the embodiments, the signal 362A generated by the adjustment device 120 can be provided to the driver 140 through the controller 130. In the embodiments, each of the bits of the signal 362A can be transmitted to gates of the transistors of the post driver 240. The first bit of the signal 362A can be regarded as the signal 261A1 for driving the transistor 2401. The second bit of the signal 362A can be regarded as the signal 261A2 for driving the transistor 2402. The third bit of the signal 362A can be regarded as the signal 261A3 for driving the transistor 2403. The fourth bit of the signal 362A can be regarded as the signal 261A4 for driving the transistor 2404. The fifth bit of the signal 362A can be regarded as the signal 261A5 for driving the transistors 2405A and 2405B.

In the embodiments, the bit value can represent the resistance value of a variable resistor of the driver 140 in order to change or control the output resistance. In the embodiments, the bit value can be utilized to adjust the output resistance of the driver 140. In the embodiments, the bit value can represent or correspond to voltage value when applied to the variable resistor.

Figure 3B:
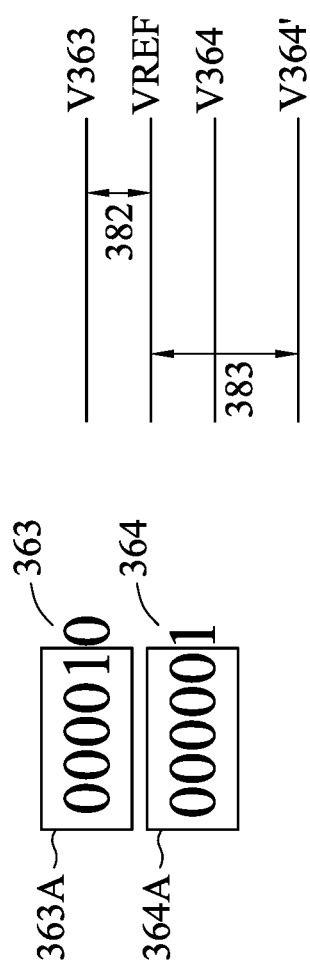
FIG. 3B is another schematic view of two signals and their bit values processed by the adjustment device, in accordance with some embodiments of the present disclosure.

FIG. 3B is another schematic view of two signals and their bit values processed by the adjustment device, in accordance with some embodiments of the present disclosure. The signals 363A and 364A can be created according to the signal 363 with a bit value V363 of "000010" and the signal 364 with a bit value V364 of "000001."

In the embodiment of FIG. 3B, the last two bits "10" of the signal 363 are both different from the last two bits "01" of the signal 364. Furthermore, the last bit of the signal 364 is "1," which represents a high bit value. Therefore, the last bit of the signal 364 is removed or disregarded to produce a disregarded signal of "00000." Afterwards, the disregarded signal can be incremented by one bit value to generate the signal 363A of "00001." As a result, the error 382 can be determined as a gap between the bit value V363 and the reference bit value VREF.

In other embodiments, the last two bits of the signals 363 and 364 are not compared. The last bit "1" of the signal 364 can be directly abandoned or disregarded to create the signal 364A of "00000" without being incremented by one bit value, which corresponds to the bit value V364' of "000000." Therefore, the error 383 can be evaluated as a gap between the bit value V364' and the reference bit value VREF. As shown in FIG. 3B, the error 382 is smaller than the error 383. The error 382 can be substantially 0.5 LSB, and the error 383 can be substantially 1.5 LSB. Compared to the method of directly removing the last bit which results in the error 383, the proposed method of comparing the last two bits can contribute the error 382 less than the error 383. Therefore, the accuracy can be improved by obtaining 6-bit resolution with 5-bit post driver without sacrificing power consumption and capacitance loading.

Figure 3C:
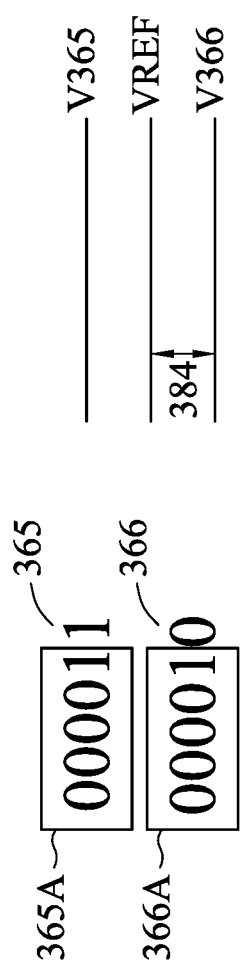
FIG. 3C is another schematic view of two signals and their bit values processed by the adjustment device, in accordance with some embodiments of the present disclosure.

FIG. 3C is another schematic view of two signals and their bit values processed by the adjustment device, in accordance with some embodiments of the present disclosure. The signals 365A and 366A can be created based on the comparison between the signal 365 with a bit value V365 of "000011" and the signal 366 with a bit value V366 of "000010."

In the embodiment of FIG. 3C, the last bit "1" of the signal 365 is different from the last bit "0" of signal 366. The second-to-last bit "1" of the signal 365 is identical to the second-to-last bit "1" of signal 366. Because one of the last two bits of signal 365 is identical to one of the last two bits of the signal 366, the last bit of the signal 366 can be disregarded to generate the signal 366A of "00001." Therefore, the error 384 between the bit value V366 and the reference bit value VREF is approximately 0.5 LSB.

Figure 3D:
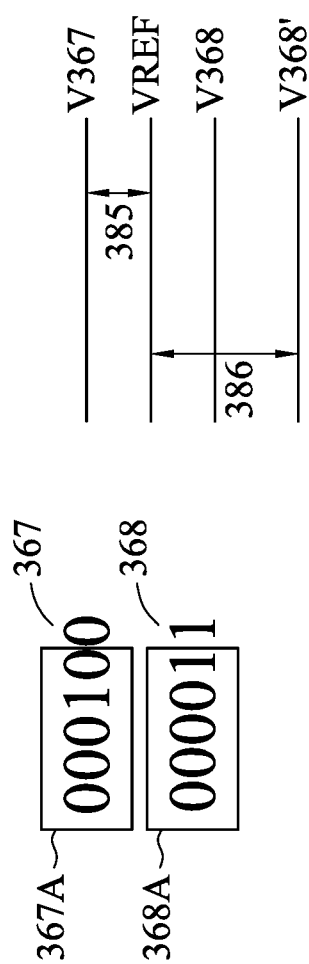
FIG. 3D is another schematic view of two signals and their bit values processed by the adjustment device, in accordance with some embodiments of the present disclosure.

FIG. 3D is another schematic view of two signals and their bit values processed by the adjustment device, in accordance with some embodiments of the present disclosure. The signals 367A and 368A can be created according to the signal 367 with a bit value V367 of "000100" and the signal 368 with a bit value V368 of "000011."

The last two bits "00" of the signal 367 are both different from the last two bits "11" of the signal 368. Furthermore, the last bit of the signal 368 is "1," which represents a high bit value. Therefore, the last bit of the signal 368 is removed or disregarded to produce a disregarded signal of "00001." Afterwards, the disregarded signal can be incremented by one bit value to generate the signal 367A of "00010." As a result, the error 385 can be determined as a gap between the bit value V367 and the reference bit value VREF.

In other embodiments, the last two bits of the signals 367 and 368 are not compared. The last bit "1" of the signal 368 can be directly abandoned or disregarded to create the signal 368A of "00001" without being incremented by one bit value, which corresponds to the bit value V368' of "000010." Therefore, the error 386 can be evaluated as a gap between the bit value V368' and the reference bit value VREF. As shown in FIG. 3D, the error 385 is smaller than the error 386. The error 385 can be substantially 0.5 LSB, and the error 386 can be substantially 1.5 LSB.

Compared to the method of directly removing the last bit which results in the error 386, the proposed method of comparing the last two bits can contribute the error 385 less than the error 386. Accuracy can be improved by obtaining 6-bit resolution with 5-bit post driver instead of 6-bit post driver, and thus the power consumption the capacitance loading can be decreased by removing the pre-driver stage before the extra branch of the post driver. Moreover, signal bandwidth and quality can also be improved as the capacitance loading is reduced accordingly.

Figure 4A:
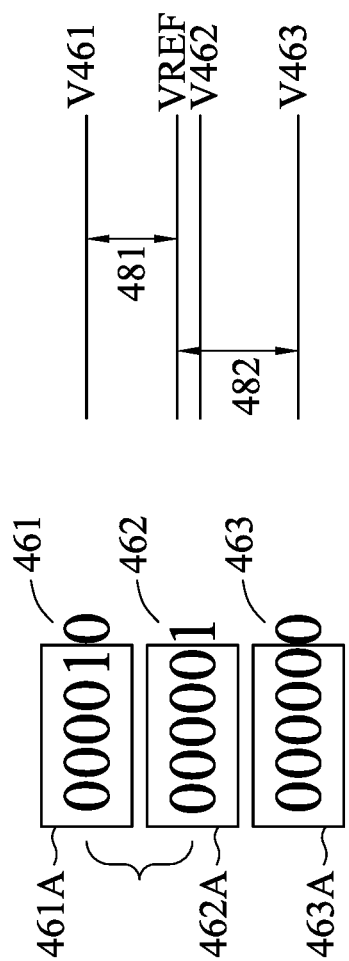
FIG. 4A is a schematic view of three signals and their bit values processed by the adjustment device, in accordance with some embodiments of the present disclosure.

FIG. 4A is a schematic view of three signals and their bit values processed by the adjustment device, in accordance with some embodiments of the present disclosure. Three successive signals 461, 462 and 463 are provided by the calibration device 110 with bit values V461, V462 and V463, respectively. The signal 463 is subsequent to the set of signals 461 and 462. In addition, the signal 462 being the middle one of the three successive signals can approximate the reference bit value VREF representing the set of signals 461 and 462.

In some embodiments, the last two bits "01" of the signal 462 are both different from the last two bits "10" of the signal 461. Furthermore, the last bit of the signal 462 is "1," which represents a high bit value. Therefore, the last bit of the signal 462 is removed or disregarded to produce a disregarded signal of "00000." Afterwards, the disregarded signal can be incremented by one bit value to generate the signal 461A of "00001." As a result, the error 481 can be determined as a gap between the bit value V461 and the reference bit value VREF.

In other embodiments, the last two bits of the signals 461 and 462 are not compared. The last bit "1" of the signal 462 can be directly abandoned or disregarded to create the signal 462A of "00000" without being incremented by one bit value, which corresponds to the bit value V463 of "000000." Therefore, the error 482 can be evaluated as a gap between the bit value V463 and the reference bit value VREF. Compared to the method of directly removing the last bit which results in the error 482, the proposed method of comparing the last two bits can contribute the error 481 less than the error 482. Therefore, the accuracy can be improved by obtaining 6-bit resolution with 5-bit post driver without sacrificing power consumption and capacitance loading.

Figure 4B:
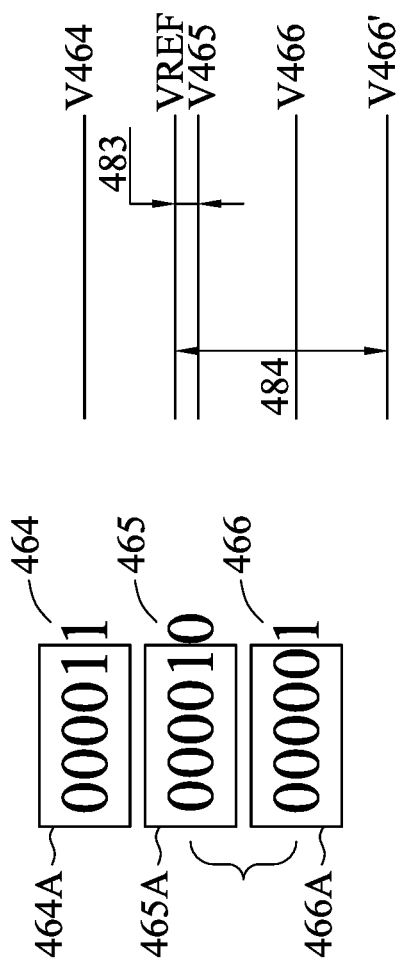
FIG. 4B is another schematic view of three signals and their bit values processed by the adjustment device, in accordance with some embodiments of the present disclosure.

FIG. 4B is another schematic view of three signals and their bit values processed by the adjustment device, in accordance with some embodiments of the present disclosure. The signal 464 can be prior to the set of signals 465 and 466. In some embodiments, the last two bits "01" of the signal 466 are both different from the last two bits "10" of the signal 465. Furthermore, the last bit of the signal 466 is "1," which represents a high bit value. Therefore, the last bit of the signal 466 is removed or disregarded to produce a disregarded signal of "00000." Afterwards, the disregarded signal can be incremented by one bit value to generate the signal 465A of "00001." As a result, the error 483 can be determined as a gap between the bit value V465 and the reference bit value VREF.

In other embodiments, the last two bits of the signals 465 and 466 are not compared. The last bit "1" of the signal 466 can be directly abandoned or disregarded to create the signal 466A of "00000" without being incremented by one bit value, which corresponds to the bit value V466' of "000000." Therefore, the error 484 can be evaluated as a gap between the bit value V466' and the reference bit value VREF. As shown in FIG. 4B, the error 483 is much smaller than the error 484.

Figure 4C:
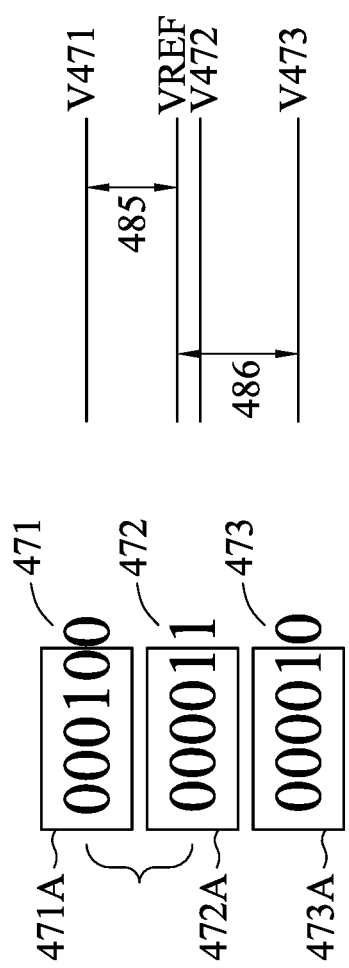
FIG. 4C is another schematic view of three signals and their bit values processed by the adjustment device, in accordance with some embodiments of the present disclosure.

FIG. 4C is another schematic view of three signals and their bit values processed by the adjustment device, in accordance with some embodiments of the present disclosure. The signal 473 is subsequent to the set of signals 471 and 472. In some embodiments, the last two bits "11" of the signal 472 are both different from the last two bits "00" of the signal 471. Furthermore, the last bit of the signal 472 is "1," which represents a high bit value. Therefore, the last bit of the signal 472 is removed or disregarded to produce a disregarded signal of "00001." Afterwards, the disregarded signal can be incremented by one bit value to generate the signal 471A of "00010." As a result, the error 485 can be determined as a gap between the bit value V471 and the reference bit value VREF.

In other embodiments, the last two bits of the signals 471 and 472 are not compared. The last bit "1" of the signal 472 can be directly abandoned or disregarded to create the signal 472A of "00001" without being incremented by one bit value, which corresponds to the bit value V473 of "000010." Therefore, the error 486 can be evaluated as a gap between the bit value V473 and the reference bit value VREF. As shown in FIG. 4C, the error 485 is smaller than the error 486.

Figure 4D:
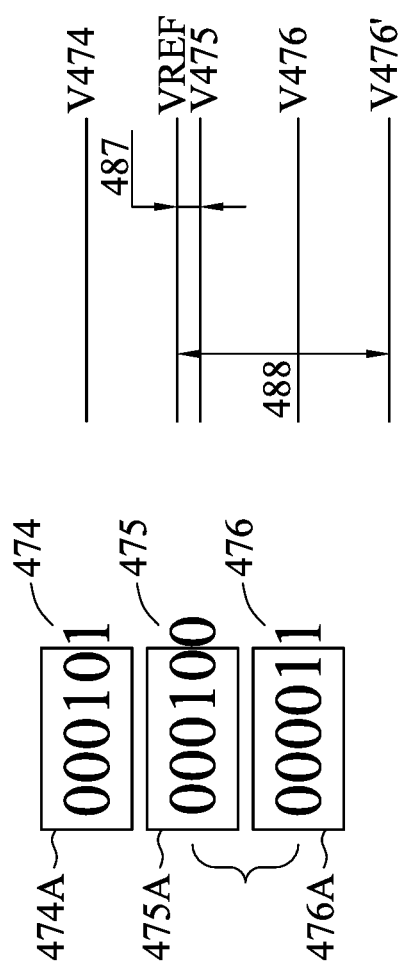
FIG. 4D is another schematic view of three signals and their bit values processed by the adjustment device, in accordance with some embodiments of the present disclosure.

FIG. 4D is another schematic view of three signals and their bit values processed by the adjustment device, in accordance with some embodiments of the present disclosure. The signal 474 can be prior to the set of signals 475 and 476. In some embodiments, the last two bits "11" of the signal 476 are both different from the last two bits "00" of the signal 475. Furthermore, the last bit of the signal 476 is "1," which represents a high bit value. Therefore, the last bit of the signal 476 is removed or disregarded to produce a disregarded signal of "00001." Afterwards, the disregarded signal can be incremented by one bit value to generate the signal 475A of "00010." As a result, the error 487 can be determined as a gap between the bit value V475 and the reference bit value VREF.

In other embodiments, the last two bits of the signals 475 and 476 are not compared. The last bit "1" of the signal 476 can be directly abandoned or disregarded to create the signal 476A of "00001" without being incremented by one bit value, which corresponds to the bit value V476' of "000010." Therefore, the error 488 can be evaluated as a gap between the bit value V476' and the reference bit value VREF. As shown in FIG. 4D, the error 487 is smaller than the error 488.

Compared to the method of directly removing the last bit which results in the error 488, the proposed method of comparing the last two bits can contribute the error 487 less than the error 488. Accuracy can be improved by obtaining 6-bit resolution with 5-bit post driver instead of 6-bit post driver, and thus the power consumption the capacitance loading can be decreased by removing the pre-driver stage before the extra branch of the post driver. Moreover, signal bandwidth and quality can also be improved as the capacitance loading is reduced accordingly.

Figure 5:
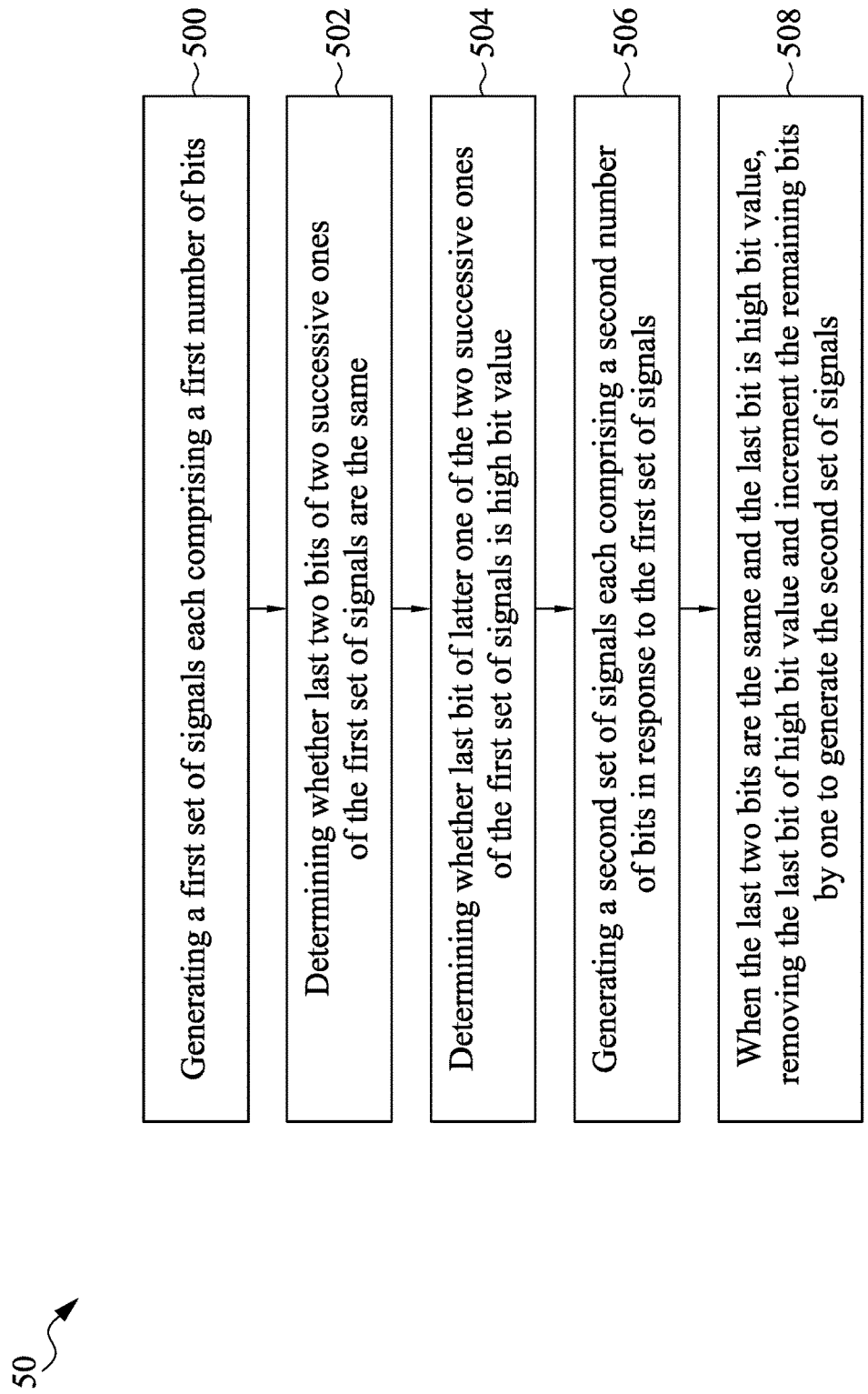
FIG. 5 illustrates a flow chart including operations for operating a semiconductor circuit, in accordance with some embodiments of the present disclosure.

FIG. 5 illustrates a flow chart including operations for operating a semiconductor circuit, in accordance with some embodiments of the present disclosure. In operation 500, a first set of signals each comprising a first number of bits are generated by a calibration device. In operation 502, whether the last two bits of two successive ones of the first set of signals are different or not is determined by a finite state machine (FSM) of the adjustment device.

Furthermore, in operation 504, whether the last bit of the latter one of the two successive ones of the first set of signals is a high bit value or not is determined by the FSM. In operation 506, a second set of signals each comprising a second number of bits in response to the first set of signals are generated by an adjustment device. In operation 508, when the last two bits are different and the last bit is a high bit value, the last bit of the high bit value is removed and the remaining bits are incremented by one to generate the second set of signals by the adjustment device.

Figure 6:
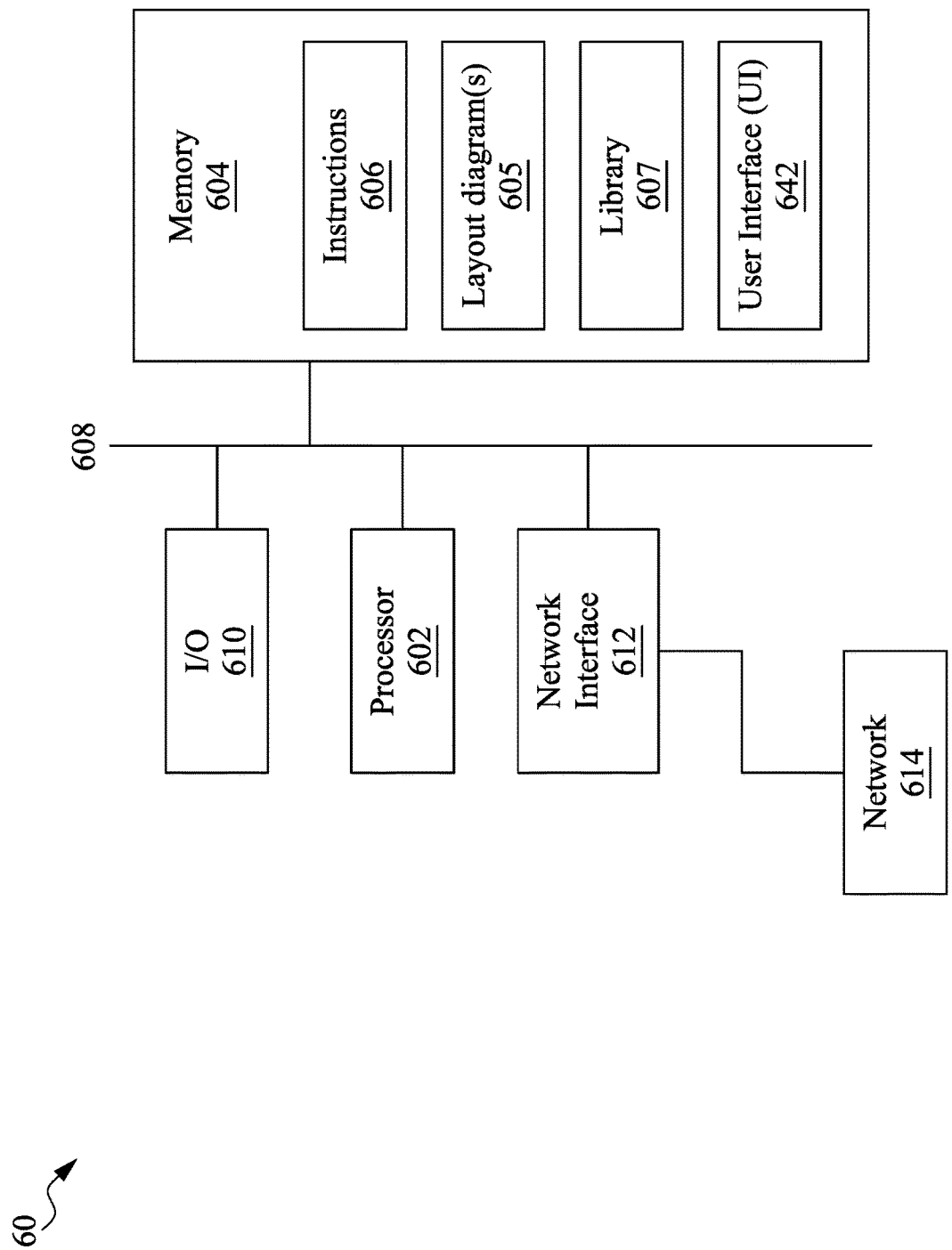
FIG. 6 is a block diagram of a system of operating and calibrating a semiconductor circuit, in accordance with some embodiments.

FIG. 6 is a block diagram of a system 60 of operating and calibrating a semiconductor circuit, in accordance with some embodiments. The system 60 can include, for example, an electronic design automation (EDA) system. In some embodiments, the system 60 includes an automatic placement and routing (APR) system. Methods described herein of operating and calibrating a semiconductor circuit, in accordance with one or more embodiments, are implementable, for example, using the system 60, in accordance with some embodiments.

In some embodiments, the system 60 is a general purpose computing device including a hardware processor 602 and a memory 604. The memory 604 may be a computer-readable storage medium. The storage medium, amongst other things, is encoded with computer program code or a set of executable instructions 606. Execution of instructions 606 by hardware processor 602 represents (at least in part) an EDA tool which implements a portion or all of a method according to an embodiment, e.g., the methods described herein in accordance with one or more embodiments (hereinafter, the noted processes and/or methods).

The processor 602 may be electrically coupled to the memory 604 (such as a computer-readable storage medium) via the bus 608. The processor 602 may be electrically coupled to an I/O interface 610 by bus 608. A network interface 612 may be electrically connected to processor 602 via bus 608. Network interface 612 may be connected to a network 614, so that processor 602 and the memory 604 are capable of connecting to external elements via network 614. Processor 602 may be configured to execute computer program code 606 encoded in memory 604 in order to cause system 60 to be usable for performing a portion or all of the noted processes and/or methods. In one or more embodiments, the processor 602 is a central processing unit (CPU), a multi-processor, a distributed processing system, an application specific integrated circuit (ASIC), and/or a suitable processing unit.

In one or more embodiments, the memory 604 may be an electronic, magnetic, optical, electromagnetic, infrared, and/or semiconductor system (or apparatus or device). For example, the memory 604 may include a semiconductor or solid-state memory, a magnetic tape, a removable computer diskette, a random access memory (RAM), a read-only memory (ROM), a rigid magnetic disk, and/or an optical disk. In one or more embodiments using optical disks, memory 604 includes a compact disk-read only memory (CD-ROM), a compact disk-read/write (CD-R/W), and/or a digital video disc (DVD).

In one or more embodiments, the memory 604 may store computer program code (instructions) 606 configured to cause system 60 (where such execution represents, at least in part, the EDA tool) to be usable for performing a portion or all of the noted processes and/or methods. In one or more embodiments, the memory 604 may store information which facilitates performing a portion or all of the noted processes and/or methods. In one or more embodiments, the memory 604 may store library 607 of standard cells including such standard cells as disclosed herein and one or more layout diagrams 605 such as those disclosed herein.

The system 60 may include I/O interface 610. I/O interface 610 may be coupled to external circuitry. In one or more embodiments, I/O interface 610 may include a keyboard, keypad, mouse, trackball, trackpad, touchscreen, and/or cursor direction keys for communicating information and commands to the processor 602.

The system 60 may include network interface 612 coupled to processor 602. Network interface 612 may allow system 60 to communicate with network 614, to which one or more other computer systems are connected. Network interface 612 may include wireless network interfaces such as BLUETOOTH, WIFI, WIMAX, GPRS, or WCDMA. Network interface 612 may include wired network interfaces such as ETHERNET, USB, or IEEE-1364. In one or more embodiments, a portion or all of the noted processes and/or methods, are implemented in two or more systems 60.

The system 60 may be configured to receive information through I/O interface 610. The information received through I/O interface 610 may include one or more of instructions, data, design rules, libraries of standard cells, and/or other parameters for processing by processor 602. The information may be transferred to processor 602 via the bus 608. System 60 may be configured to receive information related to a UI through I/O interface 610. The information may be stored in memory 604 as user interface (UI) 642.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods is implemented as a software application that is a portion of an EDA tool. In some embodiments, a portion or all of the noted processes and/or methods are implemented as a software application running on the system 60. In some embodiments, a layout diagram which includes standard cells is generated using a tool such as VIRTUOSO® available from CADENCE DESIGN SYSTEMS, Inc., or another suitable layout generating tool.

In some embodiments, the processor 602 is realized as functions of a program stored in a non-transitory computer readable recording medium. Examples of a non-transitory computer readable recording medium may include, but are not limited to, an external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Some embodiments of the present disclosure provide a semiconductor circuit. The semiconductor circuit includes a calibration device, an adjustment device and a driver. The calibration device is configured to continuously generate a first signal including a first number of bits. The adjustment device is configured to continuously receive the first signal and generate a second signal according to the last two bits of the first signal The second signal includes a second number of bits, and the second number is different from the first number. The driver is electrically coupled to the adjustment device, wherein an output resistance of the driver is controllable in response to the second signal.

Some embodiments of the present disclosure provide a semiconductor device. The semiconductor device includes a calibration device and an adjustment device. The calibration device is configured to generate a first set of signals each including a first number of bits. The adjustment device is configured to generate a second set of signals in response to the first set of signals respectively. Each of the second set of signals includes a second number of bits, the second number is less than the first number, and the second set of signals is generated by determining whether the last two bits of two successive ones of the first set of signals are different and whether the last bit of the latter one of the two successive ones of the first set of signals is a high bit value.

Some embodiments of the present disclosure provide a method for operating a semiconductor device. The method includes generating, by a calibration device, a first set of signals each including a first number of bits; generating, by an adjustment device, a second set of signals each including a second number of bits in response to the first set of signals; determining, by a finite state machine of the adjustment device, whether the last two bits of two successive ones of the first set of signals are different; and determining, by the FSM, whether the last bit of the latter one of the two successive ones of the first set of signals is a high bit value.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor circuit, comprising:
a calibration device, configured to continuously generate a first signal comprising a first number of bits;
an adjustment device, configured to continuously receive the first signal and generate a second signal according to last two bits of the first signal, wherein the second signal comprises a second number of bits, and the second number is different from the first number; and
a driver, electrically coupled to the adjustment device, wherein an output resistance of the driver is controllable in response to the second signal, wherein when the last two bits of the first signal are different from the last two bits of another first signal prior to the first signal and the last bit of the first signal is a high bit value, the adjustment device is configured to provide a disregarded first signal by disregarding the last bit of the first signal, and the disregarded first signal is incremented by one bit value to generate the second signal.

2. The semiconductor circuit of claim 1, wherein when one of the last two bits of the first signal is identical to one of the last two bits of the another first signal, the adjustment device is configured to disregard the last bit of the first signal to generate the second signal.

3. The semiconductor circuit of claim 1, wherein when the last bit of the first signal is a low bit value, the adjustment device is configured to disregard the last bit of the first signal to generate the second signal.

4. The semiconductor circuit of claim 1, wherein the calibration device is configured to detect an electrical feature of the driver in order to continuously generate the first signal.

5. The semiconductor circuit of claim 4, wherein the electrical feature comprises a process, voltage or temperature.

6. The semiconductor circuit of claim 1, wherein the driver comprises a post driver, and the post driver comprises a pull-up portion and a pull-down portion.

7. The semiconductor circuit of claim 6, wherein the pull-up portion comprises a plurality of transistor sets, the number of the transistor sets is identical to the first number, and the second signal is transmitted to gates of the plurality of transistor sets.

8. The semiconductor circuit of claim 7, further comprising:
a controller, electrically coupled between the driver and the adjustment device, and configured to distribute the second signal to the plurality of transistor sets.

9. The semiconductor circuit of claim 1, further comprising:
a multiplexer, electrically coupled to the driver, and configured to enhance the frequency of the second signal by arranging the second number of bits in series.

10. A semiconductor circuit, comprising:
a calibration device, configured to generate a first set of signals, each comprising a first number of bits; and
an adjustment device, configured to generate a second set of signals in response to the first set of signals, wherein each of the second set of signals comprises a second number of bits, the second number is less than the first number, and the second set of signals is generated by determining whether the last two bits of two successive ones of the first set of signals are different and whether the last bit of the latter one of the two successive ones of the first set of signals is a high bit value, wherein when the last two bits are different and the last bit is a high bit value, the adjustment device is configured to remove the last bit and increment the remaining bits by one to generate the second set of signals.

11. The semiconductor circuit of claim 10, wherein when at least one of the last two bits is the same, the adjustment device is configured to remove the last bit of the high bit value for generating the second set of signals.

12. The semiconductor circuit of claim 10, wherein when the last bit is a low bit value, the adjustment device is configured to remove the last bit of the high bit value for generating the second set of signals.

13. The semiconductor circuit of claim 10, wherein the first set of signals further comprises an additional signal prior or subsequent to the two successive ones of the first set of signals to form three successive ones of the first set of signals.

14. The semiconductor circuit of claim 13, wherein the middle one of the three successive ones of the first set of signals approximates a reference value representing the first set of signals.

15. The semiconductor circuit of claim 10, further comprising:
a driver, configured to be detected by the calibration device, wherein an output resistance of the driver is adjusted according to the second set of signals.

16. The semiconductor circuit of claim 15, wherein the adjustment device comprises a finite state machine, and the calibration device is configured to monitor the driver by utilizing a process, voltage and temperature calibration.

17. A method for operating a semiconductor circuit, comprising:
generating, by a calibration device, a first set of signals each comprising a first number of bits;
determining, by a finite state machine of an adjustment device, whether the last two bits of two successive ones of the first set of signals are different;
determining, by the FSM, whether the last bit of the latter one of the two successive ones of the first set of signals is a high bit value; and
generating, by an adjustment device, a second set of signals each comprising a second number of bits in response to the first set of signals, wherein when the last two bits are different and the last bit is a high bit value, removing the last bit of the high bit value and incrementing the remaining bits by one to generate the second set of signals.

18. The semiconductor circuit of claim 8, further comprising:
a switch, controlled by the controller and configured to timely deliver the second signal to the driver.

19. The semiconductor circuit of claim 15, further comprising:
a switch, configured to timely deliver the second set of signals to the driver.

20. The method of claim 17, further comprising:
detecting an electrical feature of a driver electrically coupled to the adjustment device in order to generate the first set of signals, wherein an output resistance of the driver is controllable in response to the second set of signals.

* * * * *